US011104987B2

(12) United States Patent
Schier et al.

(10) Patent No.: US 11,104,987 B2
(45) Date of Patent: Aug. 31, 2021

(54) COATED CUTTING TOOL AND A METHOD FOR ITS PRODUCTION

(71) Applicant: WALTER AG, Tubingen (DE)

(72) Inventors: Veit Schier, Echterdingen (DE); Ulrich Albers, Starzach-Borstingen (DE); Dominic Diechle, Herrenberg (DE)

(73) Assignee: WALTER AG, Tubingen (DE)

( * ) Notice: Subject to any disclaimer, the term of this patent is extended or adjusted under 35 U.S.C. 154(b) by 0 days.

(21) Appl. No.: 16/616,381

(22) PCT Filed: May 22, 2018

(86) PCT No.: PCT/EP2018/063298
§ 371 (c)(1),
(2) Date: Nov. 22, 2019

(87) PCT Pub. No.: WO2018/215410
PCT Pub. Date: Nov. 29, 2018

(65) Prior Publication Data
US 2020/0102638 A1    Apr. 2, 2020

(30) Foreign Application Priority Data
May 24, 2017  (EP) .................... 17172776

(51) Int. Cl.
C23C 14/06 (2006.01)
B23B 27/14 (2006.01)
C23C 14/08 (2006.01)
C23C 14/34 (2006.01)
C23C 14/35 (2006.01)

(52) U.S. Cl.
CPC ........ *C23C 14/0641* (2013.01); *B23B 27/148* (2013.01); *C23C 14/081* (2013.01); *C23C 14/3485* (2013.01); *C23C 14/35* (2013.01); *B23B 2226/125* (2013.01); *B23B 2228/10* (2013.01)

(58) Field of Classification Search
CPC ... B23B 27/14; B23B 2228/10; C23C 14/071; C23C 14/35; C23C 14/3485; C23C 14/0641
USPC .......... 51/307, 309; 428/336, 697, 698, 699, 428/701, 702
See application file for complete search history.

(56) References Cited

U.S. PATENT DOCUMENTS

| 8,691,378 | B2 * | 4/2014 | Schier ................. C23C 14/083 |
| | | | 51/309 |
| 2009/0252973 | A1 | 10/2009 | Cremer |
| 2010/0183900 | A1 * | 7/2010 | Wallin ................. C23C 14/081 |
| | | | 204/192.16 |
| 2010/0260560 | A1 * | 10/2010 | Schier ................. C23C 14/024 |
| | | | 407/119 |
| 2011/0171509 | A1 * | 7/2011 | Nakagiri ............. H01M 2/1653 |
| | | | 429/94 |
| 2013/0202896 | A1 * | 8/2013 | Pettersson ........... C23C 14/0641 |
| | | | 428/448 |
| 2014/0193637 | A1 * | 7/2014 | Schier ................. C23C 14/325 |
| | | | 428/698 |
| 2014/0339917 | A1 | 11/2014 | Krassnitzer et al. |
| 2016/0369386 | A1 | 12/2016 | Krassnitzer |

FOREIGN PATENT DOCUMENTS

| CA | 2665044 | * | 4/2008 |
| DE | 102011053372 A1 | | 3/2013 |
| EP | 2392688 A1 | | 12/2011 |
| JP | 2002-053946 | * | 2/2002 |
| JP | 2011-189419 | * | 9/2011 |
| WO | 2011036022 A1 | | 3/2011 |
| WO | 2014109425 A1 | | 7/2014 |

OTHER PUBLICATIONS

Luo Q et al: "Hybrid HIPIMS and DC magnetron sputtering deposition of TiN coatings: Deposition rate, structure and tribological properties", Surface and Coatings Technology, vol. 236, Jul. 9, 2013, pp. 13-21.

* cited by examiner

*Primary Examiner* — Archene A Turner
(74) *Attorney, Agent, or Firm* — Corinne R. Gorski

(57) ABSTRACT

A coated cutting tool includes a substrate of cemented carbide, cermet, cBN, ceramics or HSS and a coating of a nitride layer, which is a High Power Impulse Magnetron Sputtering (HIPIMS) deposited layer of a nitride of one or more of Ti, Zr, Hf, V, Ta, Nb, Cr, Si and Al, and a HIPIMS-deposited oxide layer being an $(Al_aMe_{1-a})_2O_3$ layer, $0.05 \leq a \leq 1$, wherein Me is one or more of Ti, Mg, Ag, Zr, Si, V, Fe, Hf, B and Cr. The oxide layer is situated above the nitride layer. Also, a method is disclosed for producing a coated cutting tool having the nitride layer and oxide layer, the nitride layer and the oxide layer being deposited by a HIPIMS process.

18 Claims, No Drawings

COATED CUTTING TOOL AND A METHOD FOR ITS PRODUCTION

RELATED APPLICATION DATA

This application is a § 371 National Stage Application of PCT International Application No. PCT/EP2018/063298 filed May 22, 2018 claiming priority to EP 17172776.1 filed May 24, 2017.

The present invention relates to a coated cutting tool comprising a body of cemented carbide, cermet, HSS or ceramics with a PVD coating comprising a metal nitride and an aluminum containing oxide. The present invention also relates to a method for its production and its use for machining of ISO-S materials.

INTRODUCTION

There is a continuous desire to improve cutting tools for metal machining so that they last longer, withstand higher cutting speeds and/or other increasingly demanding cutting operations. Commonly, a cutting tool for metal machining comprises a hard substrate material such as cemented carbide which has a thin hard coating usually deposited by either chemical vapour deposition (CVD) or physical vapour deposition (PVD). More specifically, the cutting tool may be in the form of an insert for turning or milling, a drill or an endmill.

Layer combinations of a metal nitride, for example (Ti, Al)N, and an oxide layer, such as aluminum oxide are known in general. Nevertheless, nitride and oxide layers will perform very differently in a machining operation depending on various properties and parameters such as crystallinity, hardness, density, way of manufacture etc.

Hard coatings for cutting tools can be deposited by various methods which generally can be divided into two main groups, chemical vapour deposition (CVD) and physical vapour deposition (PVD). Within the group of PVD deposition there are several sub-groups such as cathodic arc deposition, ion plating and reactive sputtering. Arc-deposited coatings and sputtered coatings are in the art of PVD coatings seen as subgroups of PVD coatings having different properties. A special type of sputtering which has quite recently been developed is High Power Impulse Magnetron Sputtering (HIPIMS). The unique structure and properties of HIPIMS-deposited layers are very difficult to define and quantify from other sputtered coatings by ordinary available physical measurements. In the art of PVD coatings the term HIPIMS-coating is therefore in itself used as a definition of this type of PVD coating distinguishable from other types of PVD coatings.

Machining of ISO-S materials such as titanium and heat resistant super alloys (HRSA) puts special demands on the cutting tool. The ISO-S materials have, for example, poor heat conductivity which generates high temperatures during machining creating wear. Also, the tendency of strong work hardening of the ISO-S materials lead to risk of built up edge on the cutting tool which effects the quality of the workpiece such as poor surface finish. Furthermore, when machining titanium problems due to the high reactivity of titanium may occur especially at the high temperatures created during machining. Typically smearing is connected to the formation of built up edge.

The object of the present invention is therefore to provide a coated cutting tool which out-performs previously ones used in machining of ISO-S materials in terms of reduced amount of built up edge and therefore enabling higher cutting speeds and/or giving longer tool life time.

THE INVENTION

The object of the invention has surprisingly been achieved by a coated cutting tool comprising a substrate of cemented carbide, cermet, cBN, ceramics or HSS, with a coating comprising a nitride layer which is a High Power Impulse Magnetron Sputtering (HIPIMS)-deposited layer of a nitride of one or more of Ti, Zr, Hf, V, Ta, Nb, Cr, Si and Al, and a HIPIMS-deposited oxide layer being an $(Al_aMe_{1-a})_2O_3$ layer, $0.05 \leq a \leq 1$, wherein Me is one or more of Ti, Mg, Ag, Zr, Si, V, Fe, Hf, B and Cr, the oxide layer is situated above the nitride layer.

The thickness of the nitride layer is suitably 0.5-5 µm, or 1-4 µm.

The thickness of the oxide layer is suitably 0.1-5 µm, or 0.3-3 µm, or 0.5-1 µm.

The nitride layer can be represented by the general formula $Ti_bZr_cHf_dV_eTa_fNb_gCr_hSi_iAl_jN$, wherein $0 \leq b \leq 1$, $0 \leq c \leq 1$, $0 \leq d \leq 1$, $0 \leq e \leq 1$, $0 \leq f \leq 1$, $0 \leq g \leq 1$, $0 \leq h \leq 1$, $0 \leq i \leq 1$ and $0 \leq j \leq 1$, $b+c+d+e+f+g+h+i+j=1$.

In one embodiment the nitride layer is a nitride of Al and one or more of Zr, Hf, V, Ta, Nb, Si and Cr, preferably a nitride of Al and one or more of Ti and Cr.

In one embodiment the nitride layer is a (Ti,Al)N layer of the general formula $Ti_bAl_{1-b}N$, wherein $0<b<1$, or $0.1<b<0.9$, or $0.2<b<0.7$, or $0.3<b<0.6$.

In one embodiment the nitride layer is a (Ti,Al,Cr)N layer of the general formula $Ti_bCr_hAl_{1-b-h}N$, wherein $0<b<1$, $0<h<1$, $0<b+h<1$. In one embodiment $0.1<b<0.9$ and $0.05<h<0.8$, or $0.2<b<0.8$ and $0.05<h<0.5$.

In one embodiment the nitride layer is an (Al,Cr)N layer of the general formula $Cr_hAl_{1-h}N$, wherein $0<h<1$. In one embodiment $0.2<h<0.8$, or $0.25<h<0.75$, or $0.25<h<0.35$.

Suitably, in the $(Al_aMe_{1-a})_2O_3$ layer $0.1 \leq a \leq 1$, or $0.25 \leq a \leq 1$, or $0.5 \leq a \leq 1$, or $0.75 \leq a \leq 1$, or $0.25 \leq a \leq 0.9$, or $0.25 \leq a \leq 0.7$.

In one embodiment the $(Al_aMe_{1-a})_2O_3$ layer is an $(Al_aCr_{1-a})_2O_3$ layer.

In one embodiment the $(Al_aMe_{1-a})_2O_3$ layer is an $Al_2O_3$ layer.

The $Al_2O_3$ layer is suitably of a gamma crystal structure. The $(Al_aMe_{1-a})_2O_3$ layer is suitably of a gamma crystal structure.

In one embodiment the oxide layer is the uppermost layer of the coating.

In one embodiment the coating has a further layer on top of the oxide layer (A) for wear protection-, decorative- or wear recognition purposes. This uppermost layer has suitably a thickness of 0.1-10 µm and can for example be of nitrides such as TiN, (Ti,Al)N, CrN, HfN, carbides such as TiC, borides such as $TiB_2$ or oxides $(AlMe_2O_3, ZrO_2, TiO_2, V_2O_5)$ (including metallic interlayers) or multilayers of the forementioned.

The coating is suitably substantially free from droplets of target material on its surface.

In order to improve the adhesion between the nitride layer and the oxide layer a thin (2-200 nm) layer of metallic Al or Al+Me, Me is one or more of Ti, Mg, Ag, Zr, Si, V, Fe, Hf, B and Cr, can be deposited. During the PVD deposition of the oxide layer the metallic layer is partly or fully oxidized. Thus, in one embodiment there is a thin (2-200 nm) part of (Al,Me,O) inbetween the nitride layer and the oxide layer, the atomic ratio (Al+Me)/O being equal to or greater than ⅔. The part of (Al,Me,O) can be as a continuous layer or as inclusions of (Al,Me,O).

The substrate of the coated cutting tool can be of any kind common in the field of cutting tools for metal machining. Substrates include cemented carbide, cermet, cBN, ceramics and HSS.

In one embodiment, the substrate is cemented carbide having a composition of 10-14 wt % Co, optionally up to 10 wt % carbides or carbonitrides of one or more metals from groups 4, 5 and 6 in the periodic table of elements, and balance WC.

The metals from groups 4, 5 and 6 in the periodic table of elements are suitably belonging to the group of Ti, Ta, Nb, V, Zr, Cr, W and Mo.

The magnetic coercivity of the cemented carbide body is suitably 15-25 kA/m, or 17-22 kA/m.

For coercivity measurements it is referred to standard DIN IEC 60404-7.

The grain size of the WC, d, in the cemented carbide body is suitably 0.20-0.80 μm, or 0.30-0.70 μm, or 0.40-0.60 μm.

The grain size of the WC, d, is determined from the value of magnetic coercivity. The relationship between coercivity and grain size of WC is described, e.g., in Roebuck et al., Measurement Good Practice No. 20, National Physical Laboratory, ISSN 1368-6550, November 1999, Revised February 2009, Section 3.4.3, pages 19-20. For the purposes of this application the grain size of the WC, d, is determined according to formula (8) on page 20 in the above-mentioned literature: $K=(c_1+d_1W_{co})+(c_2+d_2W_{co})/d$. Re-arranging one gets:

$$d=(c_2+d_2W_{co})/(K-(c_1+d_1W_{co})), \text{ wherein}$$

d=WC grain size of the cemented carbide body, K=coercivity of the cemented carbide body in kA/m, herein measured according to standard DIN IEC 60404-7, $W_{co}$=wt % Co in the cemented carbide body, $c_1$=1.44, $c_2$=12.47, $d_1$=0.04, and $d_2$=−0.37.

The coated cutting tool can be a coated cutting insert, such as a coated cutting insert for turning or a coated cutting insert for milling, or a coated cutting insert for drilling, or a coated cutting insert for threading, or a coated cutting insert for parting and grooving. The coated cutting tool can also be a coated solid drill or endmill. In a preferred embodiment the coated cutting tool is a coated solid drill or coated endmill.

It has now also been provided a method for producing a coated cutting tool comprising a substrate with a coating comprising a nitride layer which is a nitride of at least Ti and Al, and an oxide layer comprising aluminum.

The method comprises depositing a 0.5-5 μm nitride layer which is a nitride of one or more of Zr, Hf, V, Ta, Nb, Si, Cr and Al, onto a substrate followed by depositing a 0.1-5 μm oxide layer being an $(Al_aMe_{1-a})_2O_3$ layer, 0.05≤a≤1, Me is one or more of Ti, Mg, Ag, Zr, Si, V, Fe, Hf, B and Cr, the nitride layer and the oxide layer are deposited by a High Power Impulse Magnetron Sputtering (HIPIMS).

In one embodiment the substrate temperature during the magnetron sputtering is from 350 to 600° C., or from 400 to 500° C.

For the deposition of the nitride layer with HIPIMS the DC bias voltage is suitably 20-100 V, or 30-75 V.

For the deposition of the nitride layer with HIPIMS the average power density is suitably 20-100 W·cm⁻², or 30-75 W·cm⁻².

The maximum local peak power density during a pulse used in the HIPIMS process in the deposition of the nitride layer is suitably more than 100 W·cm⁻², or more than 500 W·cm⁻², or more than 900 W·cm⁻².

The maximum local peak power density during a pulse used in the HIPIMS process in the deposition of the oxide layer is suitably more than 50 W·cm⁻², or more than 100 W·cm⁻², or more than 200 W·cm⁻².

The maximum local peak current density during a pulse used in the HIPIMS process in the deposition of the nitride layer is suitably more than 0.4 A·cm⁻², or more than 0.8 A·cm⁻², or more than 1.2 A·cm⁻².

The maximum local peak current density during a pulse used in the HIPIMS process in the deposition of the oxide layer is suitably more than 0.2 A·cm⁻², or more than 0.4 A·cm⁻², or more than 0.6 A·cm⁻².

For the deposition of the oxide layer with HIPIMS the unipolar bias voltage is suitably 20-400 V, or 50-200 V, or 75-150 V.

For the deposition of the oxide layer with HIPIMS the average power density is suitably 5-150 W·cm⁻², or 10-60 W·cm⁻².

The pulse length used in the HIPIMS process in both the deposition of the nitride layer and the deposition of the oxide layer is suitably from 2 μs to 200 ms, or from 10 μs to 100 ms.

The nitride layer can be represented by the general formula $Ti_bZr_cHf_dV_eTa_fNb_gCr_hSi_iAl_jN$, wherein 0≤b≤1, 0≤c≤1, 0≤d≤1, 0≤e≤1, 0≤f≤1, 0≤g≤1, 0≤h≤1, 0≤i≤1 and 0≤j≤1, b+c+d+e+f+g+h+i+j=1.

In one embodiment the nitride layer is a nitride of Al and one or more of Zr, Hf, V, Ta, Nb, Si and Cr, preferably a nitride of Al and one or more of Ti and Cr.

In one embodiment the nitride layer is a (Ti,Al)N layer of the general formula $Ti_bAl_{1-b}N$, wherein 0<b<1, or 0.1<b<0.9, or 0.2<b<0.7, or 0.3<b<0.6.

In one embodiment the nitride layer is a (Ti,Al,Cr)N layer of the general formula $Ti_bCr_hAl_{1-b-h}N$, wherein 0<b<1, 0<h<1, 0<b+h<1. In one embodiment 0.1<b<0.9 and 0.05<h<0.8, or 0.2<b<0.8 and 0.05<h<0.5.

In one embodiment the nitride layer is an (Al,Cr)N layer of the general formula $Cr_hAl_{1-h}N$, wherein 0<h<1. In one embodiment 0.2<h<0.8, or 0.25<h<0.75, or 0.25<h<0.35.

Suitably, in the $(Al_aMe_{1-a})_2O_3$ layer 0.1≤a≤1, or 0.25≤a≤1, or 0.5≤a≤1, or 0.75≤a≤1, or 0.25≤a≤0.9, or 0.25≤a≤0.7.

In one embodiment the $(Al_aMe_{1-a})_2O_3$ layer is an $(Al_aCr_{1-a})_2O_3$ layer.

In one embodiment the $(Al_aMe_{1-a})_2O_3$ layer is an $Al_2O_3$ layer.

The $Al_2O_3$ layer is suitably of a gamma crystal structure.

The $(Al_aMe_{1-a})_2O_3$ layer is suitably of a gamma crystal structure.

The present invention finally relates to the use of the coated cutting tool herein defined for machining of ISO-S materials

EXAMPLES

Example 1 (Invention)

Cemented carbide solid endmill blanks were provided having a composition of 12 wt % Co, 0.46 wt % Cr and balance WC.

The grain size $d_{wc}$, determined from coercivity 19 kA/m, was 0.5 μm.

Sample 1:

A (Ti,Al)N layer was deposited by HIPIMS using sequential power pulses provided according to the description in U.S. 2014/0339917A1. An Oerlikon Balzers S3P Ingenia equipment was used. The following process parameters/conditions were used:

Total pressure: 0.61 Pa
Ar-pressure: 0.43 Pa
$N_2$-pressure: 0.18 Pa
Substrate temperature: 430° C.
Bias voltage: −40 V DC
Bias current: −4.1 A
Power per Ti40Al60 target: 9.06 kW
Target diameter: 160 mm
Estimated max. local peak power density during pulse: 900 W·cm$^{-2}$
Estimated max. local peak current density during pulse: 1.2 A·cm$^{-2}$
On-time of pulse: 7.56 ms
Pulse frequency: 20 Hz
Deposition time: 180 minutes The layer thickness was measured to 2.8 μm on flank face. The hardness of the deposited (Ti,Al,)N layer was measured to 3300HV0.015. The reduced E-modulus was measured to 450 GPa.

Further, a very thin layer (2-20 nm) metallic (Al,Cr) (minor amounts Cr due to a Cr-containing fringe on the Al-target used) was deposited by HIPIMS using sequential power pulses. The following process parameters/conditions were used:

Ar-pressure: 0.6 Pa (=total pressure)
Substrate temperature: 430° C.
Bias voltage: 100 V unipolar pulsed
Bias current: −0.2 A, +0.3 A
Bias on-time: 10 μs
Bias off-time: 10 μs
Power: 5 kW on 3x Al-targets (with Al50Cr50 fringe)
Target diameter: 160 mm
Average power density: 8.3 W·cm$^{-2}$
On-time of pulse: 50 ms
Pulse frequency: 6.67 Hz
Deposition time: 13 s Further, an $Al_2O_3$ layer (with slight amount of Cr) was deposited in the same reactor by HIPIMS using sequential power pulses provided according to the description in U.S. 2014/0339917A1. The following process parameters/conditions were used:

Total pressure: 0.72 Pa
Ar-pressure: 0.6 Pa
$O_2$-pressure: 0.12 Pa
Substrate temperature: 430° C.
Bias voltage: 100 V unipolar pulsed
Bias current: −1.2 A, +1.3 A
Bias-On-time: 10 μs
Bias-Off-time: 10 μs
Power: 10 kW on 3x Al-targets (with Al50Cr50 fringe)
Target diameter: 160 mm
Estimated max. local peak power density during pulse: 200 W·cm$^{-2}$
Estimated max. local peak current density during pulse: 0.6 A·cm$^{-2}$
On-time of pulse: 50 ms
Pulse frequency: 6.67 Hz
Deposition time: 140 minutes The deposited $Al_2O_3$ layer contained <1 at. % of Cr.
The deposited $Al_2O_3$ layer was determined by XRD to be a gamma-$Al_2O_3$ layer. The layer thickness was measured to 0.65 μm. The hardness of the deposited $Al_2O_3$ layer was measured to 2800HV0.015. The reduced E-modulus was measured to 370 GPa.

Sample 2:

A comparative sample where the same substrate as for Sample 1 has a coating of (Ti,Al)N consisting of a bonding layer next to the substrate of (Ti,Al)N deposited by arc evaporation in an Oerlikon Balzers Innova equipment using two $Ti_{0.50}Al_{0.50}$ targets. The following process parameters/conditions were used:

$N_2$-pressure: 0.8 Pa
Substrate temperature: 550° C.
Bias voltage: 70 V
Deposition time: 4 minutes Then a main layer being a nanolayered (Ti,Al)N having an average composition of $Ti_{0.44}Al_{0.56}N$ was deposited using two $Ti_{0.33}Al_{0.67}$ targets and four $Ti_{0.50}Al_{0.50}$ targets.

$N_2$-flow: 1400 sccm
Substrate temperature: 550° C.
Bias voltage: 60 V
Deposition time: 80 minutes Finally a decorative layer of (Ti,Al)N was deposited using two $Ti_{0.33}Al_{0.67}$ targets. The following process parameters/conditions were used:

$N_2$-flow: 1400 sccm
Substrate temperature: 550° C.
Bias voltage: 60 V
Deposition time: 5 minutes The surface rougness of the coating itself was measured on individuals of samples 1 and 2 where the surface of the substrates had been polished prior to the deposition of the coating. This was made in order to minimize the influence of the roughness of the substrate to the measured surface roughness value. Surface roughness Ra were measured with a Hommel-Etamic equipment using software Turbo Wave V 7.32. Stylus sampling length 4.8 mm, 0.5 mm/s. (according to DIN EN ISO 11562/DIN EN ISO 4287). Table 1 shows the results.

TABLE 1

|  | $R_a$ (μm) |
| --- | --- |
| Sample 1 | 0.04 |
| Sample 2 | 0.09 |

The coated endmills were then tested in a milling operation in a titanium alloy.

The tool geometry for the solid round endmill was Coromant CoroMill Plura 2S342-1000-100-CMA, diameter 10 mm, 4 flute, corner radius 1 mm. Flute angle of the tool is 42°, one coolant exit per flute. All tools used in this test were from the same production order.

Work piece material: Ti6Al4V, 175×175×50 mm
Machine: Mori Seiki
Liquid cooling, external nozzles, coolant Blasocut B25 (concentration 9%) through external nozzles Test 1:
$a_p$=2.5 mm
$a_e$=2.0 mm
$V_c$=100 m/min (cutting speed in meters per minute)
$f_z$=0.04 mm/tooth (feed rate in millimeter per tooth)
Number of passes=230
Milling length=40.25 m
Machining time=79.03 min Average wear depth at the corner: 0.06 mm, average wear depth at depth of cut (DOC): 0.05 mm. Maximum wear depth at the corner: 0.07 mm, maximum wear depth at DOC: 0.05 mm.

Wear of the comparative sample was (after 160 passes equals 28 m or 54.98 min machining time in the same setup as the invention—example): Average wear depth at the corner: 0.05 mm, average wear depth at DOC: 0.23 mm. Maximum wear depth at the corner: 0.10 mm, maximum wear depth at DOC: 0.30 mm (two edges with a wear of 0.30 mm, two edges with a wear of 0.15 mm).

Test 2 (repeated once):
$a_p$=2.5 mm
$a_e$=1.0 mm
$V_c$=100 m/min (cutting speed in meters per minute)
$f_z$=0.11 mm/tooth (feed rate in millimeter per tooth)
Number of passes=120 for all tools
Milling length=21 m
Machining time=11.53 min Average wear depth at the corner: 0.08 mm, average wear depth at DOC: 0.13 mm. Maximum wear depth at the corner: 0.14 mm, maximum wear depth at DOC: 0.23 mm.

Wear of the comparative sample:

Average wear depth at the corner: 0.08 mm, average wear depth at DOC: 0.21 mm. Maximum wear depth at the corner: 0.21 mm, maximum wear depth at DOC: 0.50 mm.

After machining the endmills were inspected by SEM at a magnification of 500× for the rake face and 300× for the flank face.

It was much less smearing of the Ti-based workpiece material on the exposed (Ti,Al)N at the edge of the cutting tool of the invention (Sample 1) than on the (Ti,Al)N at the edge of the cutting tool of the comparison (Sample 2). This was the case both for the rake and flank faces.

Furthermore, It was much less built-up edge on the cutting edge of the cutting tool of the invention (Sample 1) than on the edge of the cutting tool of the comparison (Sample 2). This was the case both for the rake and flank faces.

The invention claimed is:

1. A coated cutting tool comprising a substrate of cemented carbide, cermet, cBN, ceramics or HSS, with a coating comprising a nitride layer, which is a High Power Impulse Magnetron Sputtering (HIPIMS)deposited layer of a nitride of one or more of Ti, Zr, Hf, V, Ta, Nb, Cr, Si and Al, and a HIPIMS-deposited oxide layer being an $(Al_aMe_{1-a})_2O_3$ layer, $0.05 \le a \le 1$, wherein Me is one or more of Ti, Mg, Ag, Zr, Si, V, Fe, Hf, B and Cr, the oxide layer being situated directly above the nitride layer or there is a 2-200 nm part of (Al,Me,O) between the nitride layer and the oxide layer, the atomic ratio (Al+Me)/O being equal to or greater than 2/3.

2. The coated cutting tool according to claim 1, wherein the nitride layer is a (Ti,Al)N layer of the general formula $Ti_bAl_{1-b}N$, wherein $0<b<1$.

3. The coated cutting tool according to claim 1, wherein the $(Al_aMe_{1-a})_2O_3$ layer is an $(Al_aCr_{1-a})_2O_3$ layer.

4. The coated cutting tool according to claim 1, wherein a thickness of the nitride layer is 0.5-5 μm and a thickness of the oxide layer is 0.1-5 μm.

5. The coated cutting tool according to claim 1, wherein in the $(Al_aMe_{1-a})_2O_3$ layer $0.1 \le a \le 1$.

6. The coated cutting tool according to claim 1, wherein the substrate is cemented carbide.

7. A method for producing a coated cutting tool comprising depositing a 0.1-5 μm nitride layer, which is a nitride of one or more of Ti, Zr, Hf, V, Ta, Nb, Cr, Si and Al, onto a substrate, followed by depositing a 0.1-3 μm oxide layer being an $(Al_aMe_{1-a})_2O_3$ layer, $0.05 \le a \le 1$, wherein Me is one or more of Ti, Mg, Ag, Zr, Si, V, Fe, Hf, B and Cr, the nitride layer and the oxide layer being deposited by a High Power Impulse Magnetron Sputtering (HIPIMS) process.

8. The method according to claim 7, wherein a maximum local peak power density used in the HIPIMS process in the deposition of the nitride layer is more than 100 W·cm$^{-2}$.

9. The method according to claim 7, wherein a maximum local peak power density used in the HIPIMS process in the deposition of the oxide layer is more than 50 W·cm$^{-2}$.

10. The method according to claim 7, wherein a maximum local peak current density used in the HIPIMS process in the deposition of the nitride layer is more than 0.4 A·cm$^{-2}$.

11. The method according to claim 7, wherein a maximum local peak current density used in the HIPIMS process in the deposition of the oxide layer is more than 0.2 A·cm$^{-2}$.

12. The method according to claim 7, wherein a pulse length used in the HIPIMS process in both the deposition of the nitride layer and the deposition of the oxide layer is from 2 μs to 200 ms.

13. The method according to claim 7, wherein a substrate temperature during the HIPIMS process in both the deposition of the nitride layer and the deposition of the oxide layer is from 350 to 600° C.

14. The method according to claim 7, wherein the nitride layer is a (Ti,Al)N layer of the general formula $Ti_bAl_{1-b}N$, wherein $0<b<1$, or $0.1<b<0.9$, or $0.2<b<0.7$, or $0.3<b<0.6$.

15. A method of using a coated cutting tool, comprising: providing a coated cutting tool according to claim 1; and machining ISO-S materials with the coated cutting tool.

16. The coated cutting tool according to claim 1, wherein the nitride layer is a nitride of Al and one or more of Ti and Cr.

17. A coated cutting tool comprising a substrate of cemented carbide, cermet, ceramics or HSS, with a coating comprising a nitride layer which is a High Power Impulse Magnetron Sputtering (HIPIMS) deposited layer of a nitride of one or more of Ti, Zr, Hf, V, Ta, Nb, Cr, Si and Al, and a HIPIMS-deposited oxide layer being an $(Al_aMe_{1-a})_2O_3$ layer, $0.05 \le a \le 1$, wherein Me is one or more of Ti, Mg, Ag, Zr, Si, V, Fe, Hf, B and Cr, wherein the $(Al_aMe_{1-a})_2O_3$ layer is of a gamma crystal phase, the oxide layer being situated above the nitride layer.

18. The coated cutting tool according to claim 17, wherein the nitride layer is a nitride of Al and one or more of Ti and Cr.

* * * * *